United States Patent
Parthasarathy et al.

[11] Patent Number: 6,110,804
[45] Date of Patent: Aug. 29, 2000

[54] METHOD OF FABRICATING A SEMICONDUCTOR DEVICE HAVING A FLOATING FIELD CONDUCTOR

[75] Inventors: Vijay Parthasarathy; Michael J. Zunino, both of Tempe; William R. Peterson, Chandler; Shang-Hui Tu, Phoenix, all of Ariz.

[73] Assignee: Semiconductor Components Industries, LLC, Phoenix, Ariz.

[21] Appl. No.: 08/887,718

[22] Filed: Jul. 7, 1997

Related U.S. Application Data

[63] Continuation of application No. 08/753,834, Dec. 2, 1996, abandoned.

[51] Int. Cl.[7] .................................................. H01L 21/76
[52] U.S. Cl. .......................... 438/454; 438/725; 257/205; 257/504
[58] Field of Search .................................. 257/211, 138, 257/342, 409, 205, 504; 438/454, 725

[56] References Cited

U.S. PATENT DOCUMENTS

| | | | |
|---|---|---|---|
| 4,288,801 | 9/1981 | Ronen | 257/336 |
| 4,292,729 | 10/1981 | Powell | 438/725 |
| 4,300,150 | 11/1981 | Colak . | |
| 4,614,959 | 9/1986 | Nakagawa | 257/409 |
| 4,743,952 | 5/1988 | Baliga | 257/342 |
| 4,766,474 | 8/1988 | Nakagawa et al. | 257/409 |
| 4,926,243 | 5/1990 | Nakagawa et al. | 357/84 |
| 5,220,199 | 6/1993 | Owada et al. | 357/773 |
| 5,319,222 | 6/1994 | Shekar et al. | 257/138 |
| 5,334,546 | 8/1994 | Terashima | 438/454 |
| 5,501,994 | 3/1996 | Mei | 438/200 |
| 5,587,329 | 12/1996 | Hseuh et al. | 438/454 |

*Primary Examiner*—Carl Whitehead, Jr.
*Assistant Examiner*—Khanh Duong
*Attorney, Agent, or Firm*—Robert D. Atkins

[57] ABSTRACT

A semiconductor device (10) uses a plurality of floating field conductors (26, 28) to provide a substantially uniform electric field along the surface of the drift region (17) of the device (10). This substantially uniform electric field increases the breakdown voltage per unit length of the drift region (17).

11 Claims, 2 Drawing Sheets

METHOD OF FABRICATING A SEMICONDUCTOR DEVICE HAVING A FLOATING FIELD CONDUCTOR

This application is a continuation of prior application Ser. No. 08/753,834, filed Dec. 2, 1996 abandon.

BACKGROUND OF THE INVENTION

The present invention relates, in general, to semiconductor devices, and more particularly, to semiconductor devices with improved breakdown voltage.

In the past, the semiconductor industry has utilized various techniques to provide semiconductor devices with low on-resistance, high breakdown voltage, and low cost. One common technique is to use a reduced surface field technique, commonly referred to as RESURF, to attempt providing semiconductor devices with improved breakdown characteristics. One type of RESURF generally requires counter doping portions of the drift region in order to form depletion regions that reduce electric fields at the surface of the channel region. One problem with these RESURF techniques is that the doping within the counter doped areas must be balanced with other doping levels within the device. Consequently, the device becomes very sensitive to process variations, thereby reducing the yield and increasing the cost of the device.

Additionally, the doping within the counter doped areas must not move or diffuse during subsequent manufacturing operations. This makes it difficult to integrate other semiconductor devices onto the same substrate, thereby increasing the overall cost of semiconductor devices. Furthermore, forming the counter doped areas requires additional masking and implanting operations thereby resulting in higher manufacturing costs for the semiconductor device.

Accordingly, it is desirable to have a semiconductor device having an improved breakdown voltage, low on-resistance, low cost, and that is integratable with other semiconductor devices.

DETAILED DESCRIPTION OF THE DRAWINGS

Figure 1:
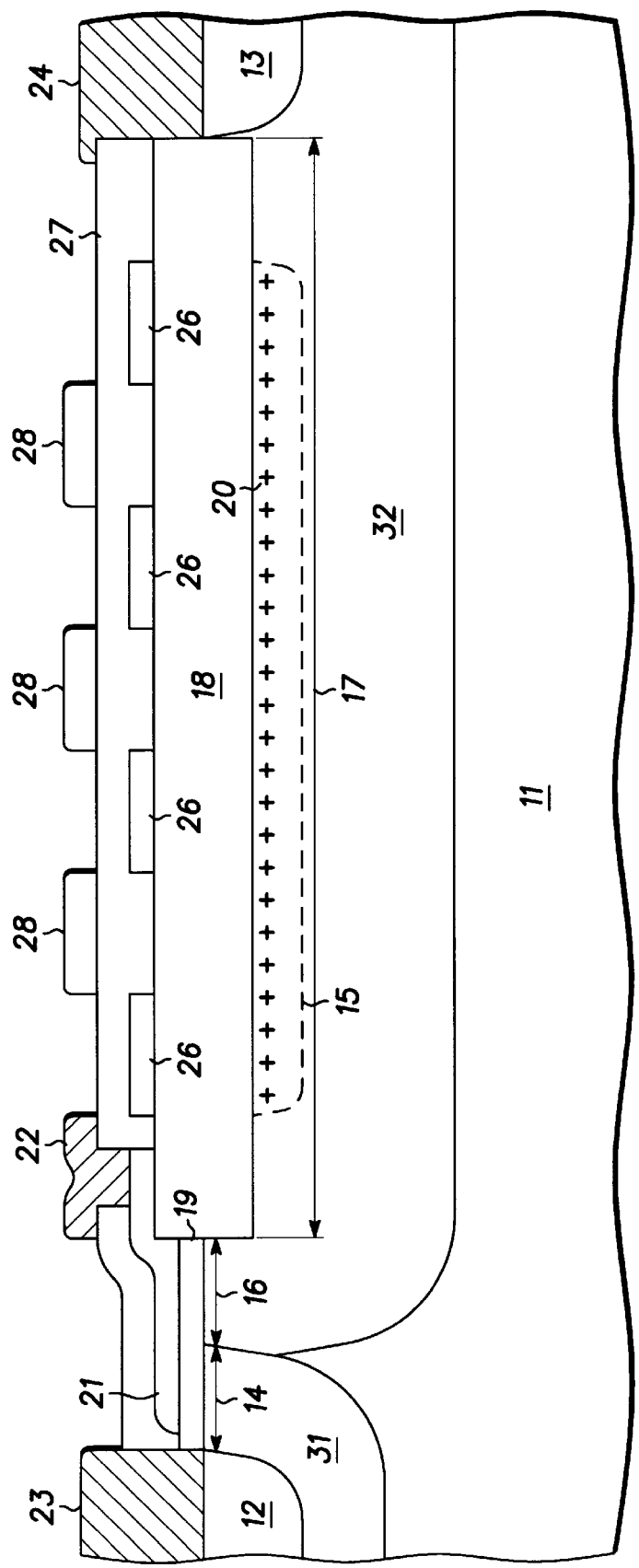
FIG. 1 illustrates an enlarged cross-sectional portion of a semiconductor device in accordance with the present invention.

FIG. 1 schematically illustrates an enlarged cross-sectional portion of a laterally diffused metal oxide semiconductor (LDMOS) device 10 that can be integrated onto a semiconductor wafer with other semiconductor devices, and that also has high break-down voltage, low manufacturing cost, and a low on-resistance. Device 10 includes a semiconductor substrate 11, for example a P-type silicon substrate, having a drain region 13 and a source region 12 formed on a surface thereof. Both source and drain regions 12 and 13, respectively, are opposite to the conductivity type of substrate 11. A channel region is formed on substrate 11 between source region 12 and drain region 13. The channel region includes an inverted region 14 of the channel, illustrated by an arrow, an accumulation region 16, illustrated by an arrow, and a drift region 17, illustrated by an arrow. Typically, drain region 13, drift region 17, and accumulation region 16 are formed in a well 32 that has an opposite conductivity to that of substrate 11. In some embodiments, well 32 extends to include tub 31 and region 12. Also, source region 12 and inverted region 14 typically are formed in a high voltage breakdown tub 31 that has the same conductivity type as substrate 11 but a higher doping concentration. A source electrode 23 contacts source region 12 and a drain electrode 24 contacts drain region 13.

A gate 21 is formed overlying substantially all of inverted region 14 and can overlie a portion of accumulation region 16. Gate 21 is insulated from regions 14 and 16 by a gate dielectric 19. Typically, gate 21 is doped polysilicon and dielectric 19 is silicon dioxide. A gate electrode 22 typically is used to provide electrical contact to gate 21. A dielectric 18 overlies drift region 17 in order to electrically isolate region 17 and to isolate drain region 13 from gate 21. The thickness of dielectric 18 varies depending on the breakdown voltage of device 10. For breakdown voltages below about forty to fifty volts, dielectric 18 may have a thickness similar to gate dielectric 19, at higher breakdown voltages dielectric 18 generally is thicker than gate dielectric 19.

To improve the breakdown voltage of device 10, a floating field conductor is formed on dielectric 18 in order to form a substantially uniform electric field at the interface of dielectric 18 and drift region 17 or near the surface of region 17. The uniform electric field extends laterally from drain region 13 to source region 12. Typically, a plurality of floating field conductors 26 are used to ensure that the electric field remains substantially uniform. Each of conductors 26 is completely floating and not electrically connected to any portion of device 10. Additionally, conductors 26 are spaced apart and are not electrically connected to each other. The spacing of conductors 26 and the width therebetween is chosen to provide the substantially uniform electric field. Conductors 26 can be a variety of conducting material including metal and doped polysilicon.

A spacer dielectric 27 covers conductors 26 to assist in ensuring that conductors 26 are electrically isolated. Secondary floating field conductors can be placed on dielectric 27 to further assist in providing the substantially uniform electric field. As illustrated, a plurality of secondary floating field conductors 28 are positioned on dielectric 27 to overlie spaces between each of conductors 26. Conductors 28 can also slightly overlap each of conductors 26. Conductors 28 are optional and assist in providing the substantially uniform electric field. Conductors 28 can be the same materials as conductors 26.

Conductors 26 and 28 are used to increase the drain-to-source breakdown voltage of device 10. In order to facilitate this breakdown voltage increase, a charge is induced onto conductors 26 and 28. This induced charge forms a depletion region 15 within drift region 17. Depletion region 15 forms a substantially uniform electric field or substantially uniform electric field lines laterally across device 10 at the interface of dielectric 18 and well 32 which facilitates increasing the breakdown voltage per unit length of drift region 17. In operation, when device 10 is in the OFF state, depletion region 15 increases the breakdown voltage per unit length of drift region 17. When device 10 is in the ON state, an inversion region 20 is formed within depletion region 15 thereby substantially preventing depletion region 15 from altering the on-resistance of device 10. The charge can be induced onto conductors 26 and 28 by several different methods. One method is to bias device 10 into breakdown thereby causing an avalanche current which charges conductors 26 and 28.

By example, a device 10 having a 700 volt drain-to-source breakdown voltage can have a drift region 17 approximately seventy-two microns in length while dielectric 18 would have a thickness of approximately one micron. For such an example, device 10 can have three conductors 26 each having a width of twelve microns with a six micron space therebetween. Also, such a device 10 can have two conductors 28 each having a width of twelve microns with a six micron spacing therebetween. The corresponding device would have a specific on-resistance less than approximately three hundred milliohms-cm$^2$.

Figure 2:
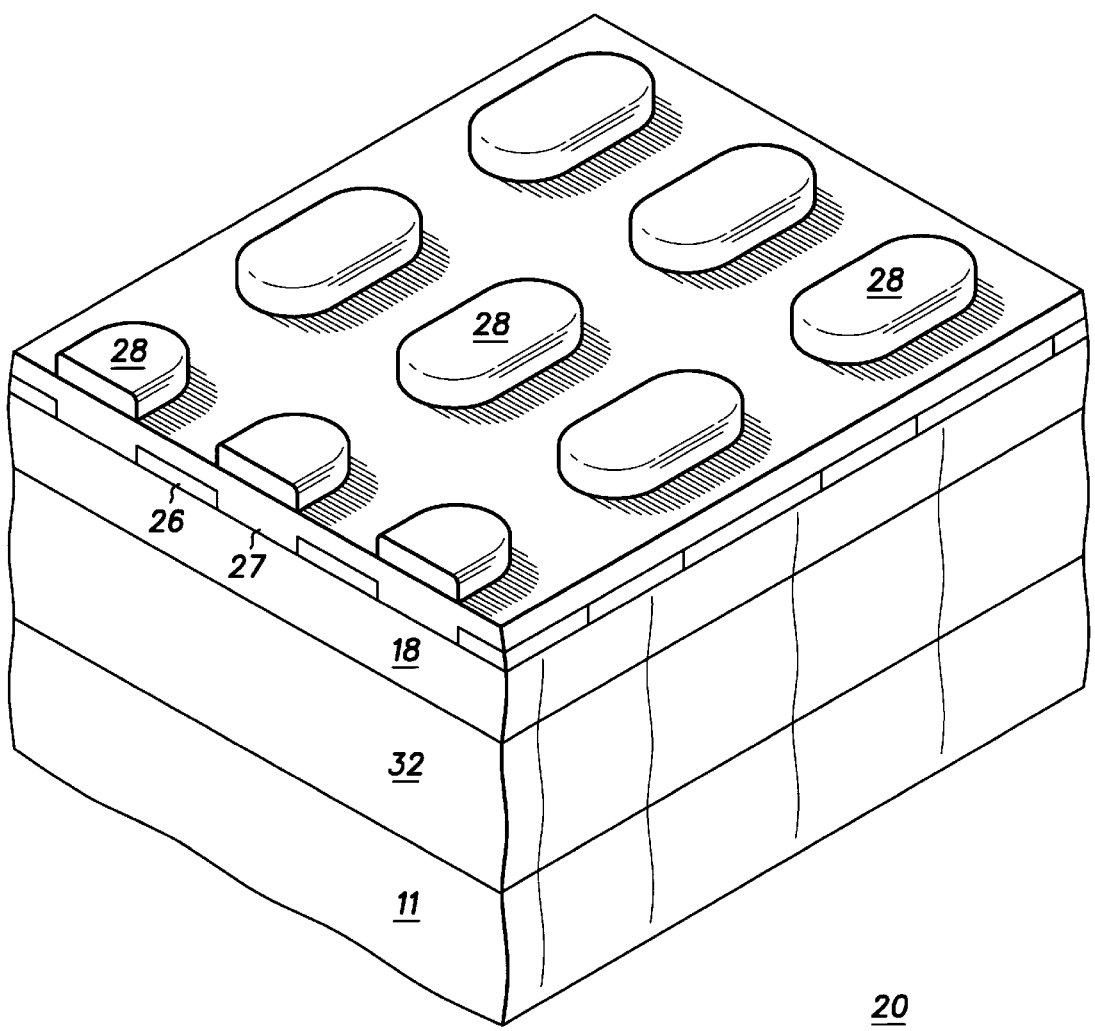
FIG. 2 illustrates an alternate embodiment of the semiconductor device of FIG. 1 in accordance with the present invention.

FIG. 2 is an isometric view that schematically illustrates a portion of an alternate embodiment of device 10 that is shown in FIG. 1. Elements having the same number are the same as the corresponding FIG. 1 elements. FIG. 2 illustrates a portion of drift region 17 merely to illustrate alternate shapes that can be used for conductors 26 and 28. Conductors 26 and 28 may take a variety of shapes and arrangements that provide a substantially uniform electric field across drift region 17. The elements that make up conductors 26 and 28 could be oval, circular, or other shapes that provide a substantially uniform field as described herein. As shown in FIG. 1, each conductor 26 and 28 is a continuous conductor stripe or row of conductor material that is substantially parallel to other conductors 26 and 28, respectively. As shown in FIG. 2 conductors 26 and 28 are each a row of unconnected oval shaped conductor elements in order to spread the electric field lines and provide the substantially uniform field. The oval shaped elements can be positioned in other patterns and do not have to be equally spaced rows as shown in FIG. 2.

As shown herein, device 10 is an LDMOS device, however, the technique of using floating field conductors is applicable to other MOS lateral devices such as IBGTs, MOS controlled thyristors (MCTs), and in high voltage device terminations. Additionally, device 10 is shown as an N-channel device but the technique is applicable to both P and N channel devices.

By now it should be appreciated that there has been provided a novel semiconductor device and associated method. By positioning floating field conductors overlying the drift region of a transistor and inducing a charge on the conductors, a depletion region is created near the surface of the drift region without counter doping the drift region to form a P-N junction. The depletion region forms a substantially uniform field at the interface of the drift region and the surface, thereby increasing the breakdown voltage per unit length of the drift region. Because a counter doped area is not required under the drift region, additional masking and implanting steps are not required. This lowers manufacturing cost, and also facilitates the integration of other devices onto the same substrate. Because counter doping is not required, no balance is required between counter doped areas and other doped areas, thereby making the device more insensitive to process variations, thus, increasing yield and further lowering costs.

What is claimed is:

1. A method of forming a semiconductor device, comprising:

forming a depletion region near a surface of a drift region of the semiconductor device to induce a charge into a first floating field conductor by positioning the first floating field conductor overlying the drift region wherein the depletion region is devoid of a P-N junction.

2. The method of claim 1 wherein positioning the first floating field conductor includes positioning a first plurality of floating field conductors that are spaced apart.

3. The method of claim 2 further comprising positioning a second plurality of floating field conductors overlying any spaces between conductors of the first plurality of floating field conductors.

4. The method of claim 1 wherein forming the depletion region includes biasing the semiconductor device into breakdown to include a charge overlying the depletion region.

5. A method for increasing a breakdown voltage of a semiconductor device, comprising the steps of:

providing the semiconductor device, wherein the semiconductor device comprises a semiconductor substrate of a first conductivity type having source region and drain regions of a second conductivity type spaced apart from each other by a channel region, a gate electrode overlying a portion of the channel region and a floating electrode overlying the semiconductor substrate, and wherein the channel region includes an inverted region, an accumulation region, and a drift region; and inducing a charge onto the floating electrode, wherein the induced charge forms a depletion region within the drift region that forms a substantially uniform electric field across the semiconductor substrate.

6. The method of claim 5, wherein the step of providing the semiconductor device includes providing a well of the second conductivity type in a portion of the semiconductor substrate between the source and drain regions and a dielectric material overlying the well such that the uniform electric field is at an interface between the dielectric material and the well.

7. The method of claim 5, wherein the step of inducing the charge includes biasing the semiconductor device into breakdown.

8. The method of claim 5, wherein the step of inducing the charge includes using an avalanche current to induce the charge.

9. The method of claim 5, wherein the step of inducing the charge includes creating the depletion region near a surface of the drift region without counter doping the drift region.

10. A method for increasing a breakdown voltage of a semiconductor device, comprising the steps of:

providing a semiconductor substrate having a transistor formed therein, the transistor including a gate, a source, a drain, and a drift region;

forming at least one floating conductor overlying the semiconductor substrate; and charging the at least one floating conductor such that a depletion region is formed within the drift region and wherein a substantially uniform electric field is formed along a surface of the drift region.

11. The method of claim 10, wherein the step of charging the at least one floating conductor includes biasing the semiconductor device into breakdown.

* * * * *